United States Patent
Bansal et al.

(10) Patent No.: US 12,373,168 B2
(45) Date of Patent: Jul. 29, 2025

(54) PRE-CARRY DATA PROCESSING APPARATUS AND METHOD

(71) Applicant: Xilinx, Inc., San Jose, CA (US)

(72) Inventors: Vijay Kumar Bansal, Hyderabad (IN); Vindhyeshwari Kumar Kashyap, Gopanpally (IN); Mahesh Narain Shukla, Hyderabad (IN)

(73) Assignee: XILINX, INC., San Jose, CA (US)

( * ) Notice: Subject to any disclaimer, the term of this patent is extended or adjusted under 35 U.S.C. 154(b) by 960 days.

(21) Appl. No.: 17/500,650

(22) Filed: Oct. 13, 2021

(65) Prior Publication Data

US 2023/0111257 A1   Apr. 13, 2023

(51) Int. Cl.
*G06F 7/50* (2006.01)
*H04N 19/91* (2014.01)

(52) U.S. Cl.
CPC .............. *G06F 7/50* (2013.01); *H04N 19/91* (2014.11)

(58) Field of Classification Search
CPC ...... H04N 19/10–85; H04N 19/90–99; H03M 7/30; H03M 7/40–4012; H03M 7/4031–405; H03M 7/4068–4093; G06F 7/50–5095
See application file for complete search history.

(56) References Cited

U.S. PATENT DOCUMENTS

| | | | | |
|---|---|---|---|---|
| 4,286,256 A | * | 8/1981 | Langdon, Jr. ....... | H03M 7/4006 341/107 |
| 5,311,177 A | * | 5/1994 | Kimura ................ | G06F 17/18 341/51 |
| 5,941,938 A | * | 8/1999 | Thayer ................. | G06F 7/5095 708/490 |
| 6,324,306 B1 | * | 11/2001 | Natsume .............. | H04N 19/91 382/246 |

OTHER PUBLICATIONS

University of Toronto, X86 registers, found at https://www.eecg.utoronto.ca/~amza/www.mindsec.com/files/x86regs.html, 2001 (Year: 2001).*

(Continued)

*Primary Examiner* — Emily E Larocque
(74) *Attorney, Agent, or Firm* — Keith Taboada (57) ABSTRACT

Disclosed approaches for accumulating pre-carry data include initializing hold sum to a sum of a LSB of the first pre-carry word of an input stream and an MSB of a second pre-carry word by a pre-carry processing circuit. For successive pre-carry words, the LSB of pre-carry word i and the MSB of pre-carry word i+1 are summed into a next sum. An FFcount is incremented by an adder circuit if the LSB of the next sum is equal to 0xFF. If the LSB of the next sum is not equal to 0xFF, the pre-carry processing circuit outputs either: the hold sum followed by FFcount consecutive 0xFF values, if the MSB of the next sum is equal to 0x00, or the hold sum plus one, followed by FFcount consecutive 0x00 values, if the MSB of the next sum is not equal to 0x00. If (Continued)

the LSB of the next sum is not equal to 0xFF, the hold sum is updated with the LSB of the next sum, and the FFcount is reset to 0. Processing repeats for successive pre-carry words in the stream.

20 Claims, 6 Drawing Sheets

(56) References Cited

OTHER PUBLICATIONS

Jarek Duda, Asymmetric numeral systems: entropy coding combining speed of Huffman coding with compression rate of arithmetic coding, arXiv:1311.2540v2 [cs.IT], Jan. 6, 2014, Center for Science of Information, Purdue University, W. Lafayette, IN 47907, USA.
Rivaz, et al., AV1 Bitstream & Decoding Process Specification, Version 1.0.0 with Errata 1, Jan. 8, 2019, The Alliance for Open Media, Copyright 2018.
https://aomedia.googlesource.com/aom/+/webm_nextgenv2/av1/common,av1/common, aom—Git at Google, Aug. 11, 2021.
Wikipedia, AV1, https://en.wikipedia.org/wiki/AV1, Aug. 11, 2021.
Jingning Han, et al., A Technical Overview of AV1, arXiv:2008.06091v2 [eess.IV], Feb. 8, 2021.
HEVC Test Model (HM), HM-16.18, TEncBinCoderCABAC.cpp, https://hevc.hhi.fraunhofer.de/HM-doc/_t_enc_bin_coder_c_a_b_a_c_8cpp_source.html, C-Function starting line No. 412, downloaded Oct. 13, 2021.
https://aomedia.googlesource.com/aom/+/refs/tags/v3.1.2/aom_dsp/entenc.c#350, Loop at line No. 350, downloaded Oct. 13, 2021.

* cited by examiner

PRE-CARRY DATA PROCESSING APPARATUS AND METHOD

TECHNICAL FIELD

The disclosure generally relates to processing of pre-carry data in entropy encoding.

BACKGROUND

Video coding standards employ entropy coding mechanisms based on arithmetic coding, an asymmetric numeral system, Huffman coding, range coding, etc. The recent AV1 standard employs an asymmetric numeral system which adds bit-level parallelism and thereby reduces clock rate demands on hardware implementations. Unlike other standards that directly produce entropy codec bits, AV1 produces an intermediate pre-carry data buffer in entropy coding process. The pre-carry buffer requires memory resources and filling the buffer introduces latency into the entropy coding process.

SUMMARY

A disclosed method includes inputting to a pre-carry processing circuit, a set of pre-carry words in order from a first pre-carry word of the set to a last pre-carry word of the set. A hold sum is initialized to a sum of a least significant byte (LSB) of the first pre-carry word and a most significant byte (MSB) of a second pre-carry word, by the pre-carry processing circuit. The pre-carry processing circuit sums the LSB of pre-carry word i and the MSB of pre-carry word i+1 into a next sum by for i greater than an ordinal position of the first pre-carry word. An adder circuit of the pre-carry processing circuit increments an FFcount in response to the LSB of the next sum being equal to 0xFF. In response to the LSB of the next sum being not equal to 0xFF, the pre-carry processing circuit outputs either: the hold sum followed by consecutive 0xFF values equal in number to the FFcount, in response to the MSB of the next sum being equal to 0x00, or the hold sum plus one, followed by consecutive 0x00 values equal in number to FFcount, in response to the MSB of the next sum being not equal to 0x00. In response to the LSB of the next sum being not equal to 0xFF, the pre-carry processing circuit updates the hold sum with the LSB of the next sum, and resets the FFcount to 0. The summing, incrementing, outputting, updating, and resetting are repeated for i=i+1.

A disclosed circuit arrangement includes a control circuit, a hold register, and a next-sum register. The control circuit is configured to input a set of pre-carry words in order from a first pre-carry word of the set to a last pre-carry word of the set. The control circuit is additionally configured to initialize a hold sum in the hold register to a sum of a least significant byte (LSB) of the first pre-carry word and a most significant byte (MSB) of a second pre-carry word. The control circuit is configured to store a sum the LSB of pre-carry word i and the MSB of pre-carry word i+1 as a next sum in the next-sum register for i greater than an ordinal position of the first pre-carry word, and to increment an FFcount, in response to the LSB of the next sum register being equal to 0xFF. The control circuit is configured to output, in response to the LSB of the next sum being not equal to 0xFF, either: the hold sum followed by consecutive 0xFF values equal in number to the FFcount, in response to the MSB of the next sum being equal to 0x00, or the hold sum plus one, followed by consecutive 0x00 values equal in number to FFcount, in response to the MSB of the next sum being not equal to 0x00. In response to the LSB of the next sum being not equal to 0xFF the control circuit is configured to update the hold sum with the LSB of the next sum. In response to the LSB of the next sum being not equal to 0xFF, the control circuit is configured to reset the FFcount to 0. The control circuit is configured to repeat the summing, incrementing, outputting, updating, and resetting for i=i+1.

A disclosed system includes one or more processors and a memory arrangement coupled to the one or more processors. The memory arrangement is configured with instructions that when executed cause the one or more processors to perform operations including inputting a set of pre-carry words in order from a first pre-carry word of the set to a last pre-carry word of the set; initializing a hold sum to a sum of a least significant byte (LSB) of the first pre-carry word and a most significant byte (MSB) of a second pre-carry word; summing the LSB of pre-carry word i and the MSB of pre-carry word i+1 into a next sum for i greater than an ordinal position of the first pre-carry word; and incrementing an FFcount in response to the LSB of the next sum being equal to 0xFF. Additional instructions cause the one or more processors, in response to the LSB of the next sum being not equal to 0xFF to: output either the hold sum followed by consecutive 0xFF values equal in number to the FFcount, in response to the MSB of the next sum being equal to 0x00, or the hold sum plus one, followed by consecutive 0x00 values equal in number to FFcount, in response to the MSB of the next sum being not equal to 0x00. Also in response to the LSB of the next sum being not equal to 0xFF, the instructions cause the one or more processors to update the hold sum with the LSB of the next sum, and reset the FFcount to 0. The processors repeat the summing, incrementing, outputting, updating, and resetting for i=i+1.

Other features will be recognized from consideration of the Detailed Description and Claims, which follow.

BRIEF DESCRIPTION OF THE DRAWINGS

Various aspects and features of the methods, circuitry, and systems will become apparent upon review of the following detailed description and upon reference to the drawings in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed methods and circuits can be employed to reduce latency for entropy encoding. In addition to reducing latency, the methods and circuits also substantially reduce memory requirements for storing a complete data set (e.g., a tile of image data) for computing entropy data. For example, the entropy encoding process specified for AV1 is a two-step process. The first part produces 16-bit pre-carry data words, and a complete tile/frame of pre-carry data is stored in a memory in order to commence the second part of entropy encoding.

The disclosed methods and circuits can process streaming input of pre-carry data and thereby eliminate the need to store a complete data set of pre-carry data prior to commencing the second part of entropy encoding. The methods and circuits reduce the latency introduced by approaches in which the complete set of pre-carry data is stored in memory prior to commencing the second part of entropy encoding. The methods and circuits also reduce memory requirements which reduces hardware requirements and operation costs.

The disclosed methods can be implemented as ASIC, in programmable logic (e.g., field programmable gate arrays (FPGAs)), on microprocessors, or any combination thereof that satisfies design objectives. According to the disclosed methods and circuits, a sequence of a plurality of pre-carry words is input to processing circuitry for a final stage of entropy encoding. The sequence can be presented as streaming input in that only a subset of the complete data set (e.g., 1, 2, 4, or 8 words) is input for processing before the next subset is input.

The processing of the pre-carry words generally involves summing the least significant byte (LSB) of pre-carry word i and the most significant byte (MSB) of pre-carry word i+1 to produce one byte of output. According to the entropy encoding, and because the input pre-carry words are two bytes, arithmetic carries can occur. That is, the sum the LSB of pre-carry word i+1 and the MSB of pre-carry word i+2 can result in a carry bit to be added to the sum of the LSB of pre-carry word i and the MSB of pre-carry word i+1.

Rather than computing byte sums from the last word of a data set to the first word of the data set, the disclosed methods and circuits compute the byte sums from the first pre-carry word to the last pre-carry word as pre-carry words are input. As pre-carry words are input, the processing circuitry sums the LSB of pre-carry word i and the MSB of pre-carry word i+1 into a next sum, and stores the LSB of the next sum as a hold sum in a hold register. While a hold sum is held in the hold register, the processing circuitry detects and counts a sequence of next sums that that have LSBs=0xFF. Each next sum is a sum of the LSB of pre-carry word j and the MSB of pre-carry word j+1, and the sequence of next sums begins at j=i+1. The counting of consecutive next sums having LSBs=0xFF accounts for the possibility of having to propagate carries across multiple next sums and add a carry to the hold sum.

When the end of a sequence of next sums having LSBs=0xFF is detected (or no sequence is detected) and the terminating next sum whose LSB is not equal to 0xFF has MSB=0x00 (no carry), the processing circuitry outputs the hold sum from the hold register followed by a sequence of 0xFF values equal in number to number of consecutive next sums having LSBs=0xFF. When the end of a sequence of next sums having LSBs=0xFF is detected (or no sequence is detected) and the terminating next sum whose LSB is not equal to 0xFF has MSB not equal to 0x00 (carry), the processing circuitry outputs the hold sum plus one from the hold register followed by a sequence of 0x00 values equal in number to number of consecutive next sums having LSBs=0xFF. The processing circuitry repeats the summing, detecting and counting of 0xFFs, and outputting, beginning at the pre-carry word that terminated the sequence of next sums having LSBs equal to 0xFF.

Figure 1:
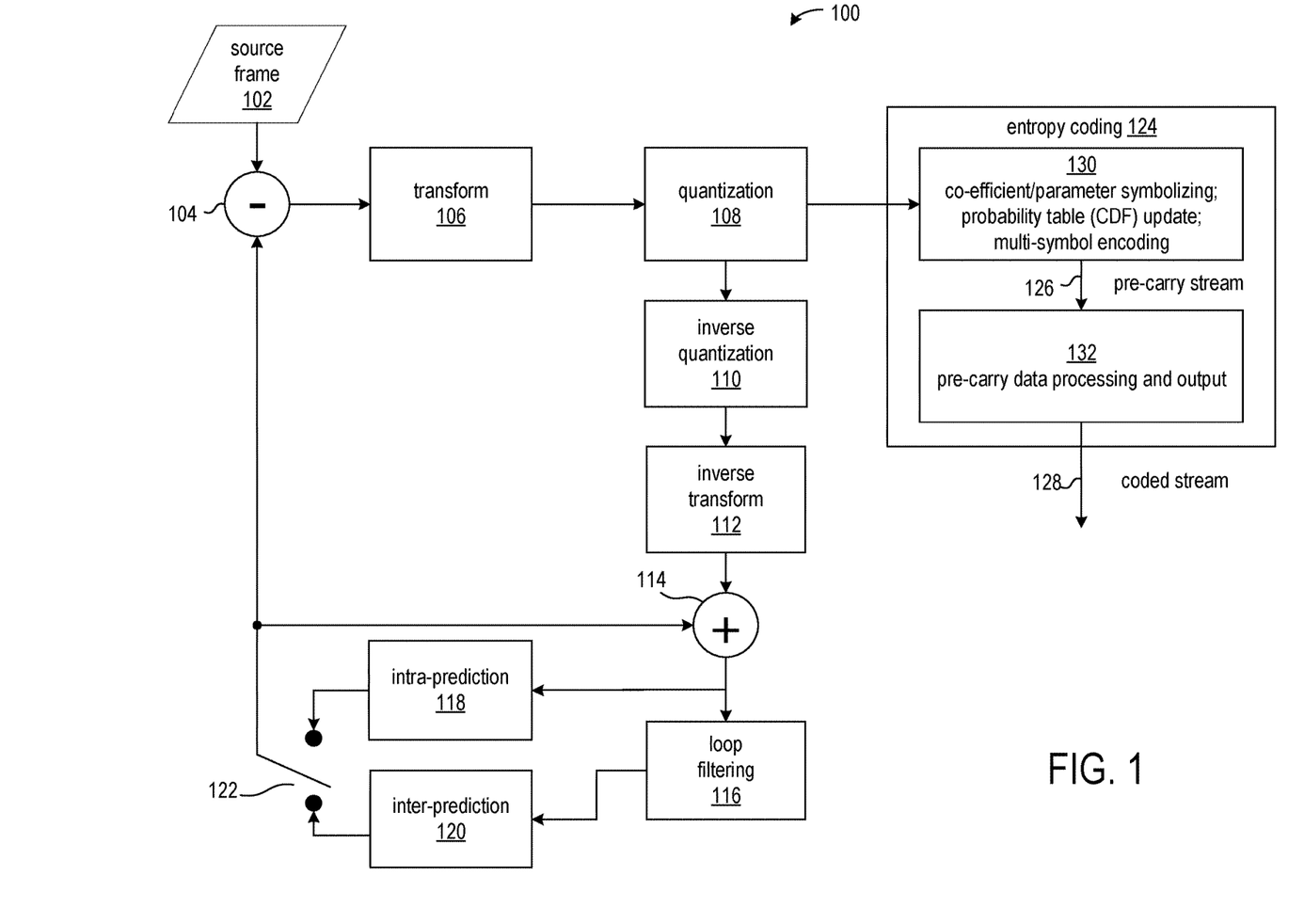
FIG. 1 shows an exemplary system in which entropy encoding is employed to compress an input data stream.

FIG. 1 shows an exemplary system 100 in which entropy encoding is employed to compress an input data stream. The exemplary system depicts an AV1 encoding system. Though the exemplary system is suitable for encoding video data, the disclosed circuits and methods can be applied to image and/or audio data as well.

The system inputs a source frame 102 and encodes the difference 104 between the source frame and a previously encoded frame.

The transform circuit 106 generally transforms a spatial sample value matrix is transformed into a transform coefficient matrix. The transform can transform different block sizes, such as alternatives in a discrete cosine transform (DCT) of a pixel domain to a frequency domain. The quantization circuit 108 obtains transform coefficients by scaling quantized coefficients. The inverse quantization circuit 110 performs the inverse of the quantization circuit 108, and obtains quantized coefficients. The inverse transform circuit 112 performs the inverse of the transform circuit 106, such as an inverse DCT. The transform coefficient matrix is transformed into a spatial sample value matrix. The summing circuit 114 reconstructs pixel samples by summing the spatial sample value matrix from the inverse transformation with inter-predicted or intra-predicted samples. The loop filtering circuit 116 applies filters to the reconstruction in order to reduce the visibility of block edges. The intra-prediction circuit 118 derives the prediction value for the current sample using previously decoded sample values in the same decoded frame. The inter-prediction circuit 120 derives the prediction value for the current frame using previously decoded frames. The switch 122 selects intra-predicted or inter-predicted pixel sample for the summing circuit 114 and source frame difference circuit 104.

The entropy coding circuitry 124, which employs an Asymmetrical Numeral System (ANS) methodology, compresses the quantized data and outputs a coded data stream. The entropy coding circuitry 124 can be segmented into two phases. The first phase 130 includes co-efficient/parameter symbolizing; probability table (CDF) update; multi-symbol encoding and generates a stream of pre-carry words 126. The second phase involves processing of the stream of pre-carry words and generation of the coded stream of bytes 128. Each byte of the final coded bytes 128 of data is generated as a sum of MSB of pre-carry word i+1 and the LSB of pre-carry word i, with a carry applied to the sum of MSB of pre-carry word i and the LSB of pre-carry word i−1. The methods and circuit described hereinafter are directed to the pre-carry data processing and output phase 132.

Figure 2:
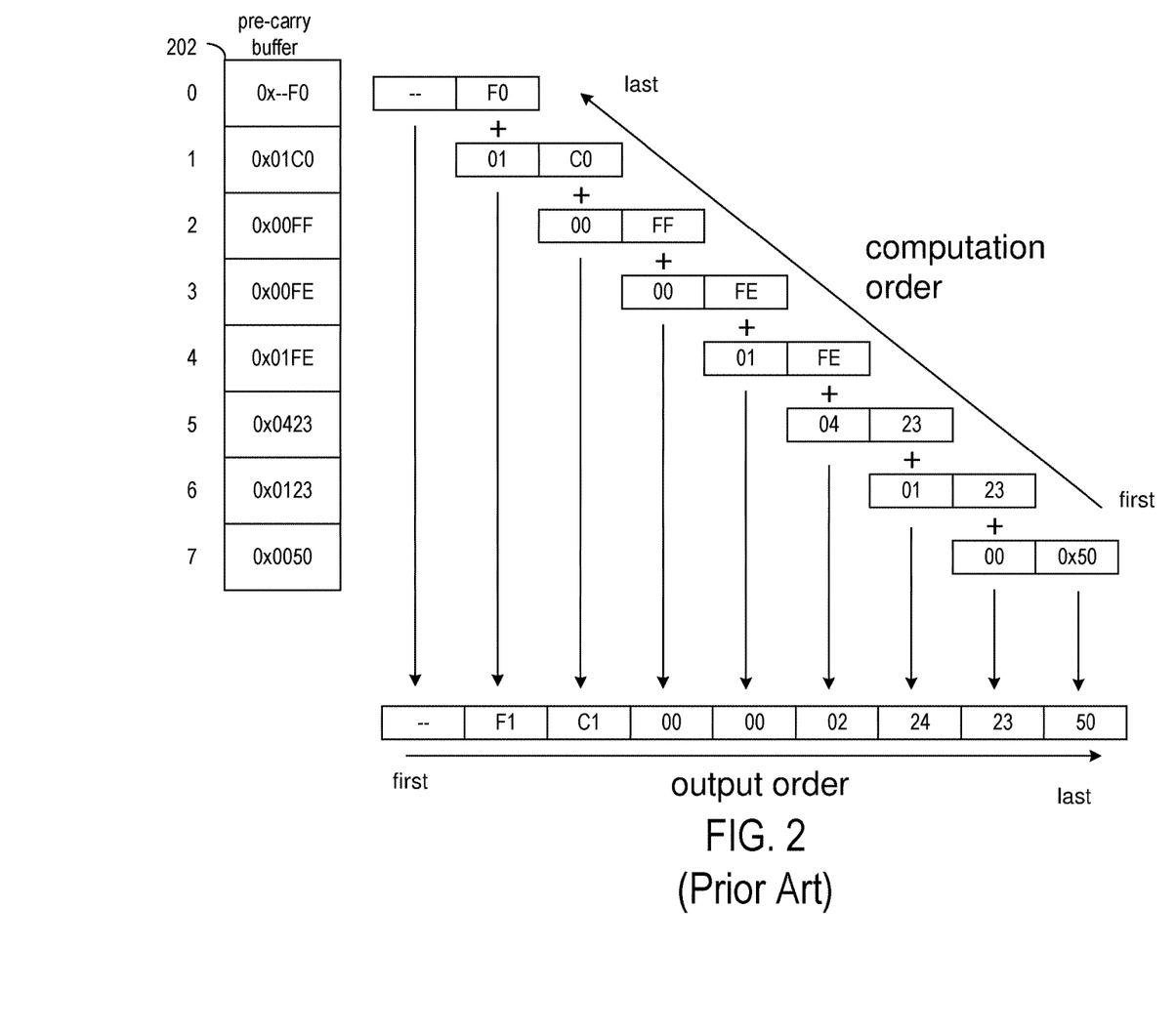
FIG. 2 shows an example of the computation of a coded byte stream from an input set of pre-carry words according to prior approaches.

FIG. 2 shows an example of the computation of a coded byte stream from an input set of pre-carry words according to prior approaches. The exemplary set of pre-carry data includes 8 pre-carry words, and the pre-carry buffer 202 is sized to store the complete set. For ease of explanation, the example shows a buffer having 8 pre-carry words indexed from i=0 to i=7, though in actual applications complete pre-carry data sets and buffer sizes are much larger. For example, a buffer can be as large as 5 MB, assuming a maximum tile width of 4096, a maximum tile height of 2304, a bit depth of 10 bits, and a YUV420 format factor of 1.5, and a minimum compression ratio of 3.5 4096*2304*10*1.5/8=~17 MB; 17 MB/3.5=~5 MB). Before processing of pre-carry data can begin, the complete set of pre-carry data must be present in the pre-carry buffer, and for large pre-carry data sets, significant latency can be introduced in the entropy encoding process.

The complete set of pre-carry data is buffered before initiating processing in order to handle the possibility of carries propagating from the sum computed from the last two pre-carry words of the set to the sum computed from the first two pre-carry words of the set. Though such long chains of carries are not common, the buffer is provided for the worst case scenario. Thus, even though the worst case may rarely occur, the buffer incurs latency in the processing of pre-carry byte sums and add to hardware and operational costs. Generally, a carry from a sum of the MSB of pre-carry word i+1 and the LSB of pre-carry word i would propagate to the sum of MSB of pre-carry word i and the LSB of pre-carry word i−1, and carries could propagate across multiple sums. Thus, complete data set of pre-carry words is input and stored in a buffer 202 before computation is initiated.

Once the complete set of pre-carry words is available in buffer 202, the processing of the pre-carry words can commence beginning with summing the MSB of pre-carry word 7 (0x00) and the LSB of pre-carry word 6 (0x23). As pre-carry word 7 is the last word in the set, there is not an LSB of a next pre-carry word to add to the MSB of pre-carry word 7 (0x50). Therefore, the LSB of pre-carry word 7 is provided as output. In the example of FIG. 2, the pre-carry processing next computes the sum of the MSB of pre-carry word 6 (0x01) and the LSB of pre-carry word 5 (0x23) and continues computing the sums involving pre-carry words 5 through 0 in that order. The byte sums are computed in order from the last pre-carry words in the pre-carry buffer to the first pre-carry words in the buffer (right to left in the diagram). Therefore, the computed output bytes are buffered so that the output order (left to right in the diagram) can be of the output bytes computed from the first pre-carry words to the output bytes computed from the last pre-carry words.

Notably, the sum of the MSB of pre-carry word 5 (0x04) and the LSB of pre-carry word 4 (0xFE) produces a carry bit, and the LSB of pre-carry word 3 is 0xFE, which when summed with the carry bit produces the sum 0x02 and another carry bit used in summing with the LSB of pre-carry word 2 (0xFF).

The characters, "--" in the first pre-carry word indicate a don't-care value, and after completing computation of the byte sums, the value of the corresponding output byte can be ignored.

According to the disclosed approaches, pre-carry data can be input for processing as a stream instead of buffering a complete set of pre-carry data. As streaming input, the pre-carry can be input one word at a time (or two, four, or eight, for example), and the inventive approach to pre-carry processing can generate encoded output bytes as each pre-carry word is input rather than waiting for the complete pre-carry data set to be buffered.

Figure 3:
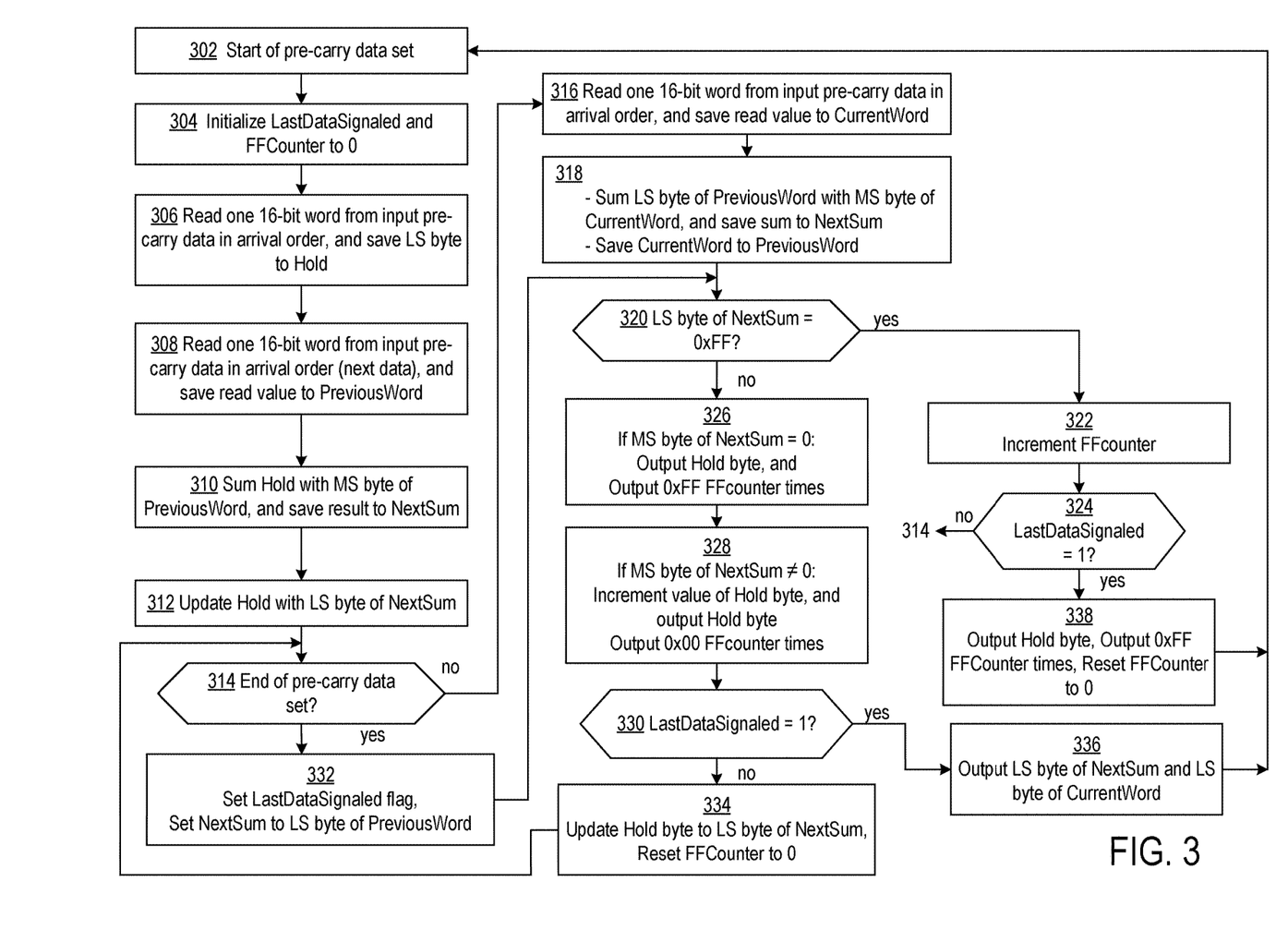
FIG. 3 shows a flowchart of a process consistent with the inventive methods and circuits.
Figure 4:
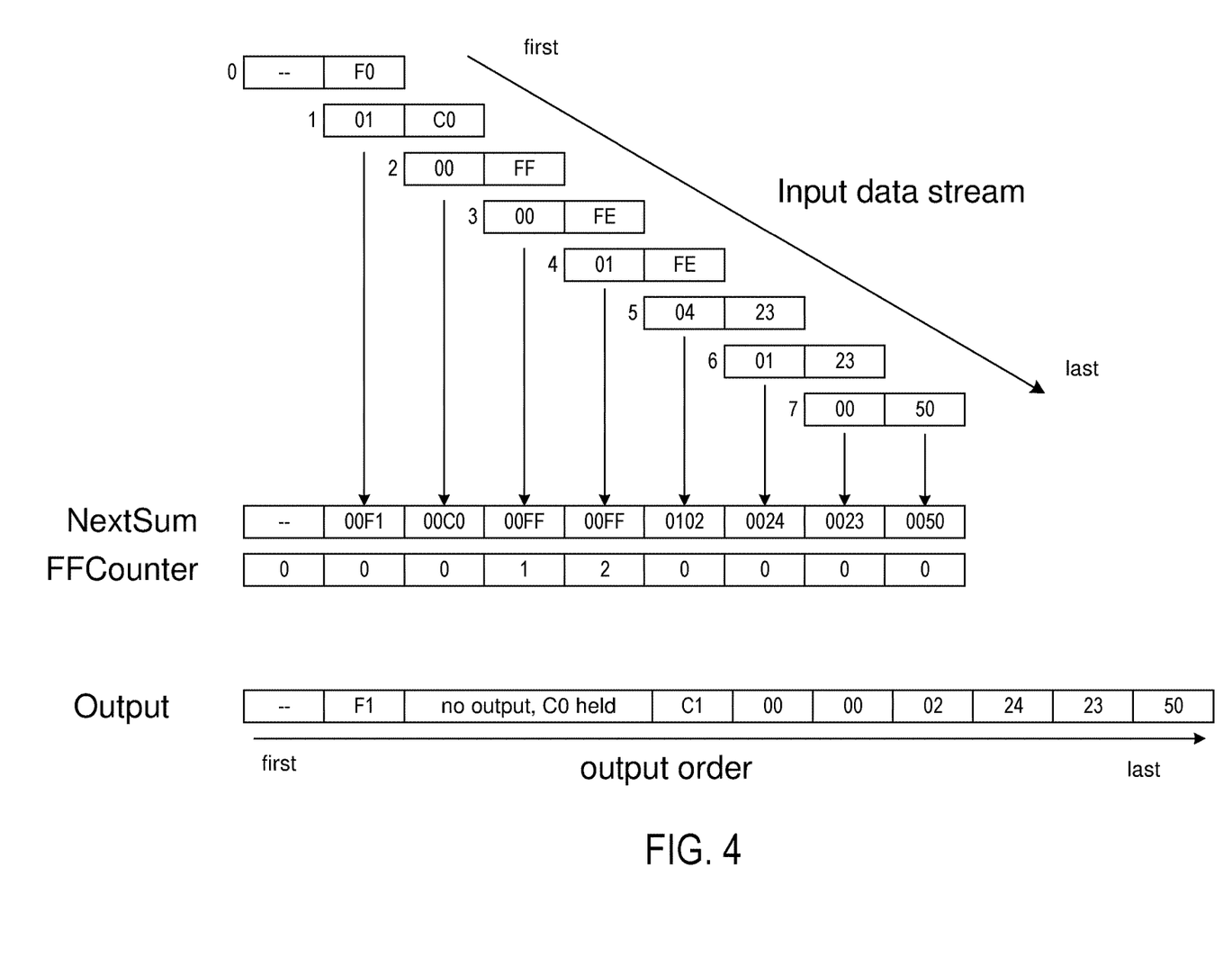
FIG. 4 shows application of the process to the example stream of pre-carry words of FIG. 2.

FIG. 3 shows a flowchart of a process consistent with the inventive methods and circuits, and FIG. 4 shows application of the process to the example stream of pre-carry words of FIG. 2. The process of FIG. 3 is described in conjunction with the example of FIG. 4.

At block 302 the process can begin in response to a signal that indicates a stream of pre-carry words of a data set can be input for processing. At block 304, the process initializes a LastDataSignaled variable and an FFCounter variable to 0.

The LastDataSignaled variable is used to indicate when the last pre-carry word in the stream has been input, and the FFCounter variable indicates a number of consecutive byte sums having the LSB equal to 0xFF. The LastDataSignaled variable can be stored in a 1-bit register, and the FFCounter variable can be stored in a register having a bit-width that can represent the maximum number of pre-carry words in a complete data set.

At block 306, the first pre-carry word is read from the input stream, and the LSB of the word is stored in a Hold variable, which can be implemented as an 8-bit register. In the example of FIG. 4, the first pre-carry word 0 of the data stream is --F0, and 0x--F0 is stored in the Hold register.

At block 308, the next word is read from the input stream, and the 16-bit (2-byte) word is stored in a PreviousWord variable, which can be implemented as a 16-bit register. In the example of FIG. 4, the second pre-carry word 1 of the input data stream is 0x01C0, and 0x01C0 is stored in PreviousWord. The MSB of PreviousWord is summed with the Hold byte at block 310, and the result is stored in the NextSum variable, which can be implemented as a 16-bit register. Continuing with the example of FIG. 4, the MSB of 0x01C0 (PreviousWord) is summed with the value the Hold value 0xF0, and the resulting sum 0x00F1 is stored in the NextSum variable, which can be implemented as a 16-bit register. At block 312, Hold is updated with the LSB of NextSum, which is initially 0xF1 in the example of FIG. 4. Generally, either the value of Hold is output or the value of Hold plus 1 is output, depending on whether or not the next sum resulted in a carry.

Decision block 314 determines whether or not the end of the pre-carry data set has been signaled. If not, at block 316 the next pre-carry word is read from the input data stream and saved in the CurrentWord variable, which can be implemented as a 16-bit register. In FIG. 4, the next pre-carry word 2 0x00FF is stored in CurrentWord. For purposes of explanation, the pre-carry words presented in the ordered input stream can be referenced by an ordinal position where the ordinal position refers to the relative position of the pre-carry word in the stream. For example, the pre-carry word at ordinal position i precedes the pre-carry word at ordinal position i+1.

At block 318, the LSB of PreviousWord is summed with the MSB of CurrentWord, the sum is saved in NextSum, and the value of CurrentWord is saved as PreviousWord. Continuing with the example of FIG. 4, the LSB 0xC0 of PreviousWord is summed with the MSB 0x00 of CurrentWord, the sum 0x0000 is saved in NextSum, and the value of CurrentWord 0x00FF is saved as PreviousWord.

Decision block 320 tests whether or not to delay output of coded bytes based on whether or not the LSB of the current NextSum value has the maximum value of 0xFF, because if the LSB of NextSum=0xFF, then a subsequent sum could produce a carry that would affect the value of Hold. If the LSB of NextSum is equal to 0xFF, which at present in the example of FIG. 4 is true, at block 322 an FFCounter variable is incremented. The value of the FFCounter indicates the number of consecutive NextSums in which the LSBs are equal to 0xFF. In the example of FIG. 4, the FFCounter is incremented by one based on the current NextSum value 0x00FF. FFCounter was initially 0 and after incrementing is equal to 1.

Decision block 324 tests whether or not the LastDataSignaled variable indicates the last pre-carry word of a complete data set has been read and processed. If not, the process returns to block 314 to test the signal that indicates the end of the pre-carry data set. Continuing the example of FIG. 4, the end of the pre-carry data set has not been reached, and the process repeats the processing of blocks 316, 318, 320, 322, and 324 for the input pre-carry words 3, 4, and 5 until the LSB of NextSum is not equal to 0xFF. At that point in the example of FIG. 4, FFCounter=2, and the LSB of NextSum=0x02.

At decision block 320, if the LSB of NextSum is not equal to 0xFF, such as in the example of FIG. 4 when the LSB of NextSum=0x02, the process performs the operations of either block 326 or block 328, depending on the value of the MSB of NextSum. The value of the MSB of NextSum when the LSB of NextSum is not equal to 0xFF indicates whether or not a carry resulted from the byte sum at the end of consecutively computed NextSum s having LSBs 0xFF, or whether or not a carry resulted from the byte sum when there were no intervening NextSums having LSBs 0xFF.

At block 326, if the MSB of NextSum=0x00, which indicates no carry, the value of Hold is output followed by 0 or more bytes having the value 0xFF, as indicated by the value of FFCounter. In the example of FIG. 4, the operations of block 326 are not performed as NextSum=0x0102 (0xFE+0x04=0x0102), and the MSB of NextSum=0x01.

At block 328, if the MSB of NextSum is not equal to 0x00, which indicates a carry, the value of Hold incremented by one to account for the carry, and the incremented value of Hold is output followed by 0 or more bytes having the value 0x00, as indicated by the value of FFCounter. In the example of FIG. 4, the operations of block 328 are performed as NextSum–0x0102, and the MSB of NextSum=0x01. Thus, the current value of Hold=0xC0 when incremented by one is 0xC1, and 0xC1 is output. The value of FFCounter is two, having counted two consecutive values of NextSum having LSBs equal to 0xFF. Thus, two bytes having the value 0x00 are output after outputting 0xC1.

At decision block 330, the process determines whether or not the LastDataSignaled variable indicates the last pre-carry word of a complete data set has been read and processed. If not, at block 334 the Hold variable is updated with the LSB of NextSum, which is currently 0x00 in the example of FIG. 4, and the FFCounter is reset to 0. The process then returns to decision block 314 to continue processing of the next pre-carry word (pre-carry word 0x0123 and then pre-carry word 0x0050 in the example of FIG. 4).

After reading and processing pre-carry word 7 (0x0050) in the example of FIG. 4, the process will detect the end of the pre-carry data set at decision block 314. At block 332, the LastDataSignaled variable is assigned the value 0b1, and NextSum is set to the LSB of PreviousWord, which is 0x23 in the example. The process continues at decision block 320 to determine whether or not the LSB of NextSum=0xFF. In the example of FIG. 4, the LSB of NextSum=0x23, and the MSB of NextSum=0. Thus, the value of Hold (0x00) is output at block 326, followed by no 0xFF bytes as FFCounter was reset to 0.

In response to decision block 330 finding the LastData-Signaled flag to be equal to 1, at block 336, the LSB of NextSum (0x23) is output followed by the LSB if Current-Word (0x50), and the process returns to block 302 to begin processing another pre-carry data set.

If the LSB of NextSum=0xFF at block 320, the FFCounter is incremented at block 322, and if decision block 324 finds the LastDataSignaled flag to be equal to 1, at block 338, the value of Hold is output, followed by a number of by bytes having values of 0xFF and the number of those bytes indicated by FFCounter. Note that the example of FIG. 4 does not exemplify the processing of block 338, as the LSB of the last computed NextSum is not equal to 0xFF. The process returns to block 302 to begin processing another pre-carry data set.

Figure 5:
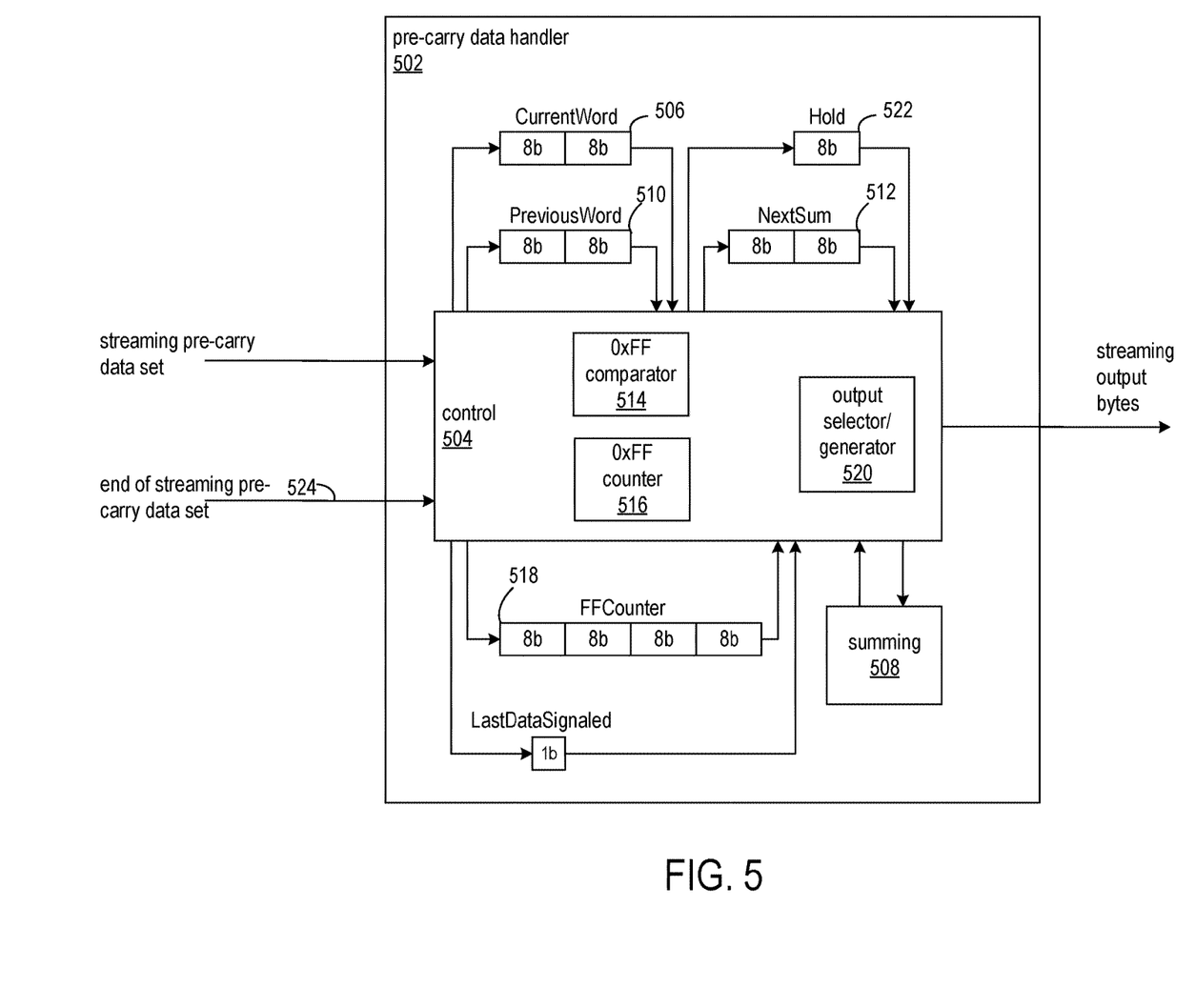
FIG. 5 shows an exemplary circuit arrangement for processing pre-carry data during entropy encoding.

FIG. 5 shows an exemplary circuit arrangement for processing pre-carry data during entropy encoding. The circuitry can be implemented in programmable logic or as an ASIC. The pre-carry data handler circuit 502 inputs a pre-carry data set as streaming data. Control circuit 504 is configured to perform the operations outlined in the flowchart of FIG. 3.

The control circuit reads each input pre-carry word i and stores the pre-carry word in CurrentWord register 506. The control circuit signals the summing circuit 508 to sum the LSB of the PreviousWord register 510 with the MSB of the CurrentWord register and stores the sum in the NextSum register 512. After summing, the control circuit stores the value in the CurrentWord register in the PreviousWord register. The control circuit can then input the next pre-carry word and store that word in the CurrentWord register.

The control circuit includes a comparator circuit 514 that compares the LSB of the NextSum register 512 to 0xFF. In response to the LSB of the NextSum register 512 being equal to 0xFF, the control circuit signals the counter circuit 516 to increment the count in the FFCounter register 518.

In response the LSB of the NextSum register 512 being not equal to 0xFF and the MSB of the NextSum register 512 being equal to 0x00, the control circuit signals the output selector 520 to output the current value in the Hold register 522 followed by a number of 0xFF values indicated by the value in the FFCounter register 518. In response the LSB of the NextSum register 512 being not equal to 0xFF and the MSB of the NextSum register 512 being not equal to 0x00, the control circuit signals the output selector 520 to output the current value in the Hold register 522 plus one followed by a number of 0x00 values indicated by the value in the FFCounter register 518. After signaling output, the control circuit updates the Hold register 522 with the LSB of the NextSum register 512.

The control circuit 504 can be responsive to signal 524, which can be asserted to indicate the end of the pre-carry data set. In response to assertion of the signal, the control circuit can set the LastDataSignaled register to 0b1, stop inputting additional pre-carry data words for byte summing, and flush any residual values, including the values from the Hold register 522, any 0xFF values, or the value of the LSB of NextSum register 512.

In an exemplary implementation, the CurrentWord register 506, PreviousWord register 510, and NextSum register 512 can be 16-bit registers; the Hold register 522 can be an 8-bit register; the FFCounter register 518 can be a 32-bit register; and the LastDataSignaled register can be a 1-bit register.

Figure 6:
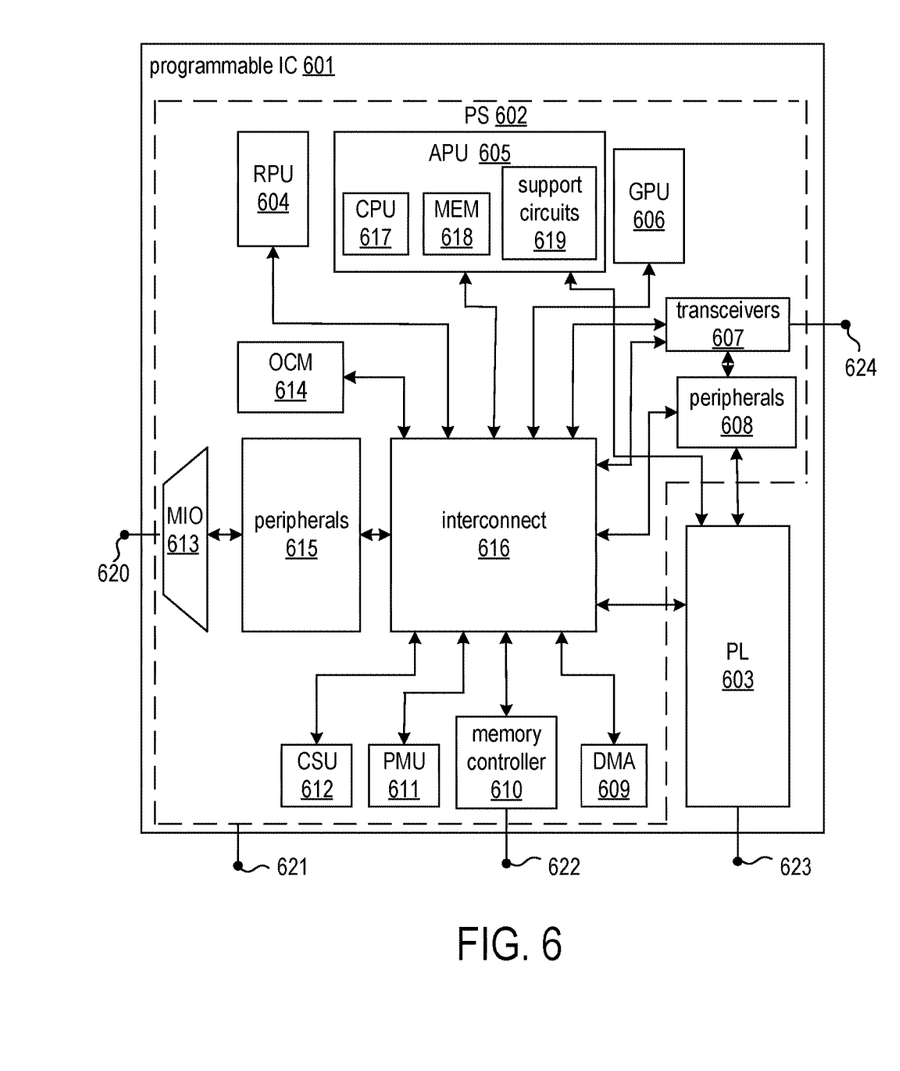
FIG. 6 is a block diagram depicting a System-on-Chip (SoC) that can host the pre-carry handling processing and circuitry described herein.

FIG. 6 is a block diagram depicting a System-on-Chip (SoC) 601 that can host the pre-carry handling processing and circuitry described herein. The pre-carry handling processing can be implemented either by one or more of the processors configured to execute program code that directs the processor(s) to operate according to the disclosed methods, or by programmable logic that implements circuitry that functions according to the disclosed methods. In the example, the SoC includes the processing subsystem (PS) 602 and the programmable logic subsystem 603. The processing subsystem 602 includes various processing units, such as a real-time processing unit (RPU) 604, an application processing unit (APU) 605, a graphics processing unit (GPU) 606, a configuration and security unit (CSU) 612, and a platform management unit (PMU) 611. The PS 602 also includes various support circuits, such as on-chip memory (OCM) 614, transceivers 607, peripherals 608, interconnect 616, DMA circuit 609, memory controller 610, peripherals 615, and multiplexed (MIO) circuit 613. The processing units and the support circuits are interconnected by the interconnect 616. The PL subsystem 603 is also coupled to the interconnect 616. The transceivers 607 are coupled to external pins 624. The PL 603 is coupled to external pins 623. The memory controller 610 is coupled to external pins 622. The MIO 613 is coupled to external pins 620. The PS 602 is generally coupled to external pins 621. The APU 605 can include a CPU 617, memory 618, and support circuits 619. The APU 605 can include other circuitry, including L1 and L2 caches and the like. The RPU 604 can include additional circuitry, such as L1 caches and the like. The interconnect 616 can include cache-coherent interconnect or the like.

Referring to the PS 602, each of the processing units includes one or more central processing units (CPUs) and associated circuits, such as memories, interrupt controllers, direct memory access (DMA) controllers, memory management units (MMUs), floating point units (FPUs), and the like. The interconnect 616 includes various switches, busses, communication links, and the like configured to interconnect the processing units, as well as interconnect the other components in the PS 602 to the processing units.

The OCM 614 includes one or more RAM modules, which can be distributed throughout the PS 602. For example, the OCM 614 can include battery backed RAM (BBRAM), tightly coupled memory (TCM), and the like. The memory controller 610 can include a DRAM interface for accessing external DRAM. The peripherals 608, 615 can include one or more components that provide an interface to the PS 602. For example, the peripherals can include a graphics processing unit (GPU), a display interface (e.g., DisplayPort, high-definition multimedia interface (HDMI) port, etc.), universal serial bus (USB) ports, Ethernet ports, universal asynchronous transceiver (UART) ports, serial peripheral interface (SPI) ports, general purpose (GPIO) ports, serial advanced technology attachment (SATA) ports, PCIe ports, and the like. The peripherals 615 can be coupled to the MIO 613. The peripherals 608 can be coupled to the transceivers 607. The transceivers 607 can include serializer/deserializer (SERDES) circuits, MGTs, and the like.

Though aspects and features may in some cases be described in individual figures, it will be appreciated that features from one figure can be combined with features of another figure even though the combination is not explicitly shown or explicitly described as a combination.

The methods and circuits are thought to be applicable to a variety of systems for processing pre-carry data in entropy encoding. Other aspects and features will be apparent to those skilled in the art from consideration of the specification. The methods and circuits may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A method, comprising:
streaming input data to a pre-carry processing circuit, the input data including pre-carry words of a set in order from a first pre-carry word of the set to a last pre-carry word of the set;
initializing a hold sum in a hold register to a sum of a least significant byte (LSB) of the first pre-carry word and a most significant byte (MSB) of a second pre-carry word, by the pre-carry processing circuit;
in response to pre-carry word i of the set being available in a first register and pre-carry word i+1 of the set being available in a second register to the pre-carry processing circuit, for i=(an ordinal position of the first pre-carry word) to i=(an ordinal position of the last pre-carry word−1):
storing a sum of the LSB of pre-carry word i and the MSB of pre-carry word i+1 into a next sum, in a next sum register, by the pre-carry processing circuit;
incrementing an FFcount by an adder circuit of the pre-carry processing circuit, in response to the LSB of the next sum register being equal to 0xFF;
in response to the LSB of the next sum register being not equal to 0xFF:
outputting by the pre-carry processing circuit, either:
the hold sum followed by consecutive 0xFF values equal in number to the FFcount, in response to the MSB of the next sum register being equal to 0x00, or
the hold sum plus one, followed by consecutive 0x00 values equal in number to FFcount, in response to the MSB of the next sum register being not equal to 0x00,
updating the hold sum with the LSB of the next sum register by the pre-carry processing circuit, and
resetting the FFcount to 0 by the pre-carry processing circuit.

2. The method of claim 1, wherein:
the initializing includes storing the sum of the LSB of pre-carry word i and the MSB of pre-carry word i+1 in an 8-bit hold register; and
the updating includes storing the LSB of the next sum in the 8-bit hold register.

3. The method of claim 2, wherein the next sum register is a 16-bit next-sum register.

4. The method of claim 3, wherein the incrementing includes storing the FFcount in a 32-bit counter register.

5. The method of claim 1, further comprising:
storing pre-carry word i+2 in a 16-bit previous-word register after the incrementing and after the updating the hold sum and before the repeating; and
the inputting includes storing a pre-carry word that consecutively follows pre-carry word i+2 in the set in a 16-bit current-word register.

6. The method of claim 1, wherein the pre-carry words of the set represent video data, image data, or audio data.

7. A circuit arrangement comprising:
a control circuit configured to stream input pre-carry words of a set in order from a first pre-carry word of the set to a last pre-carry word of the set;
a hold register;
a next-sum register;
wherein the control circuit configured to:
initialize a hold sum in the hold register to a sum of a least significant byte (LSB) of the first pre-carry word and a most significant byte (MSB) of a second pre-carry word,
in response to pre-carry word i of the set being available in a first register and pre-carry word i+1 of the set being available in a second register to, for i=(an ordinal position of the first pre-carry word) to i=(an ordinal position of the last pre-carry word−1):

store a sum of the LSB of the pre-carry word i and the MSB of pre-carry word i+1 as a next sum in the next-sum register;

increment an FFcount, in response to the LSB of the next sum register being equal to 0xFF;

output, in response to the LSB of the next sum register being not equal to 0xFF, either:
the hold sum followed by consecutive 0xFF values equal in number to the FFcount, in response to the MSB of the next sum register being equal to 0x00, or
the hold sum plus one, followed by consecutive 0x00 values equal in numberto FFcount, in response to the MSB of the next sum register being not equal to 0x00;

update, in response to the LSB of the next sum register being not equal to 0xFF, the hold sum with the LSB of the next sum;

reset, in response to the LSB of the next sum register being not equal to 0xFF, the FFcount to 0.

8. The circuit arrangement of claim 7, wherein the control circuit, hold register, and next-sum register are implemented in programmable logic.

9. The circuit arrangement of claim 7, wherein the hold register is an 8-bit register.

10. The circuit arrangement of claim 9, wherein the next sum register is a 16-bit register.

11. The circuit arrangement of claim 10, further comprising a 32-bit FFcount register, wherein the control circuit is configured to store the FFcount in the FFcount register.

12. The circuit arrangement of claim 7, further comprising:
wherein the first register is a 16-bit register;
wherein the second register is a 16-bit register; and
wherein the control circuit is configured to:
store pre-carry word i+2 in the first register after the incrementing and after the updating the hold sum and before the repeating; and
store a pre-carry word that consecutively follows pre-carry word i+2 in pre-carry words of the set in the second register.

13. The circuit arrangement of claim 7, wherein the pre-carry words represent video data, image data, or audio data.

14. A system comprising:
a processor;
a memory arrangement coupled to the processor and configured with instructions that when executed cause the processor to perform operations including:
streaming input pre-carry words of a set in order from a first pre-carry word of the set to a last pre-carry word of the set;
initializing a hold sum in a hold register to a sum of a least significant byte (LSB) of the first pre-carry word and a most significant byte (MSB) of a second pre-carry word;
in response to pre-carry word i of the set being available in a first register and pre-carry word i+1 of the set being available in a second register, for i=(an ordinal position of the first pre-carry word) to i=(an ordinal position of the last pre-carry word−1):
storing a sum of the LSB of pre-carry word i and the MSB of pre-carry word i+1 into a next sum in a next sum register;
incrementing an FFcount in response to the LSB of the next sum register being equal to 0xFF;
in response to the LSB of the next sum being not equal to 0xFF:
outputting either:
the hold sum followed by consecutive 0xFF values equal in number to the FFcount, in response to the MSB of the next sum register being equal to 0x00, or
the hold sum plus one, followed by consecutive 0x00 values equal in number to FFcount, in response to the MSB of the next sum register being not equal to 0x00,
updating the hold sum with the LSB of the next sum register, and resetting the FFcount to 0.

15. The system of claim 14, wherein:
the instructions for initializing include instructions for storing the sum of the LSB of pre-carry word i and the MSB of pre-carry word i+1 in an 8-bit hold register; and
the instructions for updating include instructions for storing the LSB of the next sum in the 8-bit hold register.

16. The system of claim 15, wherein the next sum register is a 16-bit next-sum register.

17. The system of claim 16, wherein the instructions for incrementing include instructions for storing the FFcount in a 32-bit counter register.

18. The system of claim 14, further comprising:
storing pre-carry word i+2 in a 16-bit previous-word register after the incrementing and after the updating the hold sum and before the repeating; and
the instructions for inputting include instructions for storing a pre-carry word that consecutively follows pre-carry word i+2 in the set in a 16-bit current-word register.

19. The system of claim 14, wherein the pre-carry words of the set represent video data, image data, or audio data.

20. The system of claim 14, further comprising:
a programmable device having a programmable logic subsystem and a processor subsystem; and
wherein the processor subsystem includes the processor and the memory arrangement.

* * * * *